United States Patent [19]

So

[11] Patent Number: 5,113,140

[45] Date of Patent: May 12, 1992

[54] MICROPROCESSOR-CONTROLLED HIGH-VOLTAGE CAPACITANCE BRIDGE

[75] Inventor: Eddy So, Gloucester, Canada

[73] Assignee: National Research Council of Canada, Ottawa, Canada

[21] Appl. No.: 540,772

[22] Filed: Jun. 20, 1990

[51] Int. Cl.⁵ ............................................. G01R 27/26
[52] U.S. Cl. ........................... 324/680; 324/608; 324/659; 324/683
[58] Field of Search ............... 324/679, 680, 650, 651, 324/607, 608, 659, 683

[56] References Cited

U.S. PATENT DOCUMENTS

| | | | |
|---|---|---|---|
| 3,049,666 | 8/1962 | Anderson | 324/659 |
| 3,142,015 | 7/1984 | Kusters et al. | 324/679 |
| 3,458,803 | 3/1966 | Maguire | 324/683 |
| 3,579,101 | 5/1971 | Kusters et al. | 324/679 |
| 3,593,126 | 7/1971 | May | 324/651 |
| 3,629,700 | 12/1971 | Yalof | 324/683 |
| 4,409,543 | 10/1983 | Sugihara | 324/659 |
| 4,714,875 | 12/1987 | Bailey et al. | 324/73.1 |
| 4,716,361 | 12/1987 | Sheffer | 324/608 |
| 4,724,709 | 2/1988 | Antonazzi, Sr. et al. | 324/679 |
| 4,772,844 | 9/1988 | Andeen et al. | 324/680 |
| 4,820,971 | 4/1989 | Ko et al. | 324/679 |

OTHER PUBLICATIONS

"A Self-balancing High-voltage Capacitance Bridge", O. Petersons, IEEE Transactions On Instruments & Measurement, vol. IM-13, No. 4, Dec. 1964, pp. 216-224.

"A Transformer-Ratio-Arm Bridge . . . Above 100 Volts", O. Petersons, IEEE Trans. of Power Apparatus & Systems, vol. PAS-87, No. 5, May 1968, pp. 1354-1361.

"A Wide-range High-Voltage . . . PPM Accuracy", O. Petersons et al, IEEE Trans. on Instrument & Measurement, vol. IM-24, No. 4, Dec. 1975.

Primary Examiner—Kenneth A. Wieder
Assistant Examiner—Maura K. Regan

[57] ABSTRACT

A current comparator bridge for measuring the value of an unknown capacitor includes a current comparator having a first comparator winding with an adjustable tap which is connected to one side of a standard capacitor and a second comparator winding connected to one side of an unknown capacitor, a high voltage source being connected to the other side of the capacitors. The current comparator is provided with a detection winding for detecting when the ampere-turns in the first and second comparator windings are equal and opposed to each other. In addition to the current through the standard capacitor being applied to the first comparator winding, the bridge includes a circuit to add a current through a standard conductance to the first comparator winding as well as circuits to compensate for errors. The detection winding is connected to a current-to-voltage converter with an adjustable gain which provides a signal to a phase sensitive detector. A reduced replica of the high voltage source is also applied to the phase sensitive detector which provides output signals $E_o$ and $E_{90}$ to indicate when the bridge is balanced for both in phase and quadrature components respectively. The values of the capacitance and dissipation factor for the unknown capacitor can then be determined from the balanced condition of the bridge which is designed so that it can be automatically controlled by a microprocessor and switch controller.

3 Claims, 3 Drawing Sheets

MICROPROCESSOR-CONTROLLED HIGH-VOLTAGE CAPACITANCE BRIDGE

FIELD OF THE INVENTION

This invention relates to a high-voltage alternating current-comparator capacitor bridge for measuring the values of unknown impedances, such as a capacitor with unknown capacitance and dissipation factor values, using standard capacitors and standard conductances.

BACKGROUND OF THE INVENTION

U.S. Pat. No. 3,142,015 shows one type of high voltage alternating current capacitive measuring apparatus. The current comparator device in this U.S. patent consists of a primary, a secondary, a deviation and a detection winding wound on a core with a standard capacitor being connected to a tap on the secondary winding, the other end of the standard capacitance being connected to an alternating voltage source. An unknown capacitor is connected between the voltage source and the primary winding with a null detector being connected across the detection winding. The apparatus also includes circuit means to obtain a balanced condition for a quadrature component so that a dissipation factor for the unknown capacitance can be determined. This circuit includes a further capacitor connected to the other side of the secondary winding so that almost all the voltage drop occurs across the standard capacitor while a low voltage supply is obtained across the further capacitor which is accurately proportional to the high voltage supply. This source of accurately controlled low voltage makes it practicable to obtain a correction current for the quadrature adjustment such as by applying that voltage, or a voltage of opposite polarity, through a variable resistor to the tap on the secondary winding.

U.S. Pat. No. 3,579,101 shows another similar type of measuring apparatus wherein a variable resistor is in series with the standard capacitor and secondary winding and the low voltage is applied, via a polarity reversing switch, to an autotransformer whose output is applied across the variable resistor.

A paper entitled "A Transformer-Ratio-Arm Bridge for Measuring Large Capacitors Above 100 Volts" by Oskars Pertersons in IEEE Transactions on Power Apparatus and Systems, Vol. PAS-87, No.5, May 1968 (pps 1354-1361) describes the basic operating principle of these types of high-voltage capacitance bridges. This paper also discusses various methods of compensating for errors caused by lead impedances and other factors which will be discussed in more detail later.

Another paper entitled "A Wide-Range High-Voltage Capacitance Bridge With One PPM Accuracy" by Oskars Petersons et al, in IEEE Transaction On Instrumentation And Measurement, Vol. IM-24, No.4, December 1975 (pps 336-344) describes in more detail the basic operating principle of these types of high-voltage capacitance bridges along with the nature of bridge errors and their reduction. This paper also describes circuitry to balance the bridge to obtain the capacitance value ($C_x$) of the unknown capacitance as well as it conductance ($G_x$) from which the dissipation factor DF of the unknown capacitor can be obtained. A discussion of range extending transformers is included in that paper.

SUMMARY OF THE INVENTION

It is an object of the present invention to provide an improved high-voltage current-comparator capacitance bridge measuring apparatus for measuring values of an unknown impedance, such as a capacitor, and which is particularly adaptable to be controlled by a microprocessor through a switch controller. An automatic balancing feature facilitates the use of the bridge for load loss measurement of large high-voltage inductive loads, such as shunt reactors and power transformers.

The invention consists of the provision in a current comparator bridge for measuring values of an unknown impedance, said bridge comprising (a) a current comparator having a pair of ratio windings ($N_s$, $N_x$) and a detection winding ($N_D$) for detecting an ampere turns unbalance in the comparator, (b) means for varying the number of turns on a first one ($N_s$) of said ratio windings, (c) a standard capacitor ($C_s$) having a first side connected to a first end of said first ratio winding, (d) means for connecting a first side of an unknown impedance to a first end of the second ratio winding, (e) means connecting the second end of the second ratio winding to ground, (f) means for connecting the second side of the standard capacitor and the second side of the unknown impedance to an alternating voltage input (E), (g) means connected between the second end of the first ratio winding and ground for generating a voltage replica ($E_f$) of the high voltage input, (h) converter means connected to receive said replica voltage for providing a current ($I_{GS}$) proportional to and in phase with the high voltage input, (i) means for varying the value of said proportional current, and (j) means connecting said current generating means to the first end of the first ratio winding for passing said proportional current therethrough in phase with the voltage input, the improvement comprising (k) phase sensitive detecting means connected to said detection winding and to said replica voltage for generating a first output signal ($E_O$) proportional to an ampere-turn unbalance in the comparator in phase with a reference current ($I_{NS}$) passing through the standard capacitor, and a second output signal ($E_{90}$) proportional to an ampere-turn unbalance in the comparator in quadrature with said reference current, (l) an RMS/DC converter connected to the second end of the first ratio winding for generating a third output signal ($E_{INS}$) proportional to the RMS value of the voltage input and hence proportional to the value of said reference current in the standard capacitor, and (m) a microprocessor connected to receive said first, second and third output signals for controlling said means (b) for varying the number of turns on the first ratio winding and said means (i) for varying the value of said proportional current to bring the bridge towards ampere-turn balance with the number of turns on the first ratio winding proportional to the ratio ($E_O/E_{INS}$) between said first and third signals providing a measure of the value of the reactance of the unknown impedance, said third signal ($E_{INS}$) providing a measure of the value of the reference current ($I_{NS}$), and the ratio ($E_{90}/E_{INS}$) between the second and third signals providing a measure of the value of the dissipation factor of the unknown impedance.

BRIEF DESCRIPTION OF THE DRAWINGS

Other features and advantages of the present invention will become more readily apparent from the following detailed description of the invention with reference to the accompanying drawings; in which.

DESCRIPTION OF THE PRIOR ART CIRCUITS

Figure 1:
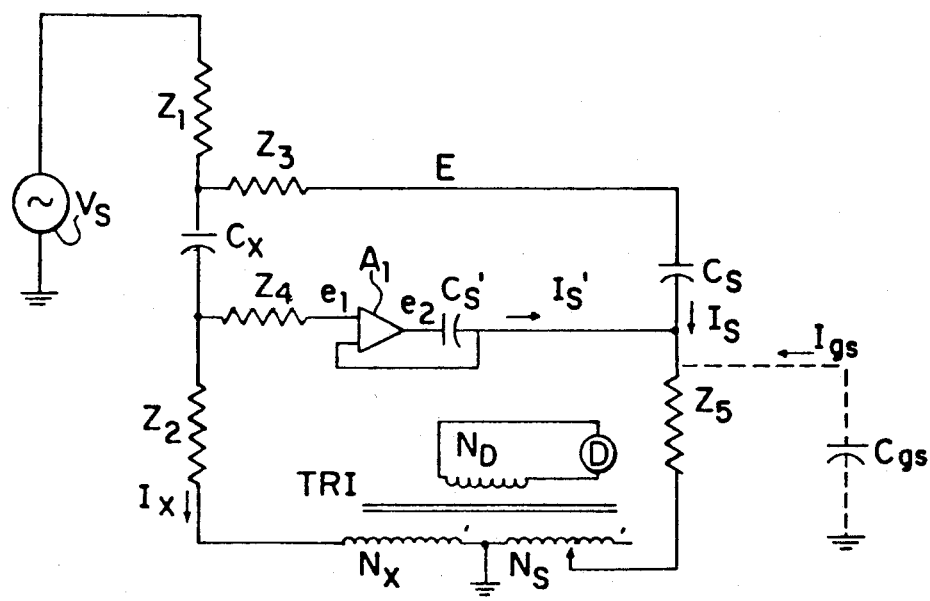
FIG. 1 illustrates a prior art capacitance bridge having a circuit to compensate for errors caused by lead impedances in both bridge arms.

FIG. 1 shows a prior art current-comparator capacitor bridge which is described in a paper by Oskars Petersons in the IEEE Transactors On Power Apparatus and Systems, Vol. PAS-87, No. 5, May 1968, pages 1354–1361. In this bridge a supply voltage $V_s$ is applied to one side of an unknown capacitor $C_x$ and a standard capacitor $C_s$, the other side of $C_x$ being connected to a winding $N_x$ of a current comparator TR1 while the other side of standard capacitor $C_s$ is connected to a tap on a winding $N_s$ of current comparator TR1. The other end of winding $N_x$ is connected to one side of winding $N_s$ and to ground. The term N indicates the number of active turns on the windings. The winding $N_x$ and $N_s$ are wound so that the current $I_x$ flowing through capacitor $C_x$ and winding $N_x$ produces a flux on the core of TR1 which opposes the flux created by the current $I_s$ flowing through standard capacitor $C_s$ and winding $N_s$ to ground. By adjusting the tap on $N_s$ these two fluxes can be made equal which produces a total flux in the core equal to O under balanced conditions. The flux in the core can be detected by a detection winding $N_D$ wound on the core, the winding $N_D$ being connected to a detector D. The tap of $N_s$ is adjusted until the bridge is balanced and detector D indicates no flux in the core. Ignoring the effects of lead impedances ($Z_1$ to $Z_3$), at the balanced condition $$I_x N_x = I_s N_s \tag{1}$$

or $$E j\omega C_x N_x = E j\omega C_s N_s \tag{2}$$

from which it can be determined that $$C_x = \frac{N_s}{N_x} \cdot C_s \tag{3}$$

If $N_x$ is constant, $C_s$ being a standard capacitor, the value of the unknown capacitor $C_x$ can be determined from the number of turns of winding $N_s$ from the tap to ground. In this case the bridge can be made direct reading with the value of the unknown capacitor $C_x$ being determined by the location of the tap on $N_s$ at the balanced condition of this bridge.

One error that occurs in the type of bridge shown in FIG. 1 is caused by lead impedances which are indicated in this circuit by $Z_1$ to $Z_4$ for the unknown capacitor $C_x$. This type of error can be compensated for by applying a correction current into the standard capacitor branch to $N_s$. An inverting amplifier $A_1$ and capacitor $C_s'$ between the low voltage sides of $C_x$ and $C_s$ generate the necessary correction current $I_s'$. In this circuit, at bridge balance $$I_x N_x = (I_s - I_s') N_s$$

since $I_s'$ is added to $N_s$ so that $$(E - e_1) j\omega C_x N_x = (E j\omega C_s + e_2 j\omega C_s') N_s \tag{5}$$

where
E is the voltage applied to $C_s$
$e_1$ is the voltage at the input to amplifier $A_1$ and,
$e_2$ is the voltage at the output of amplifier $A_1$ whose output is applied to capacitor $C_s'$.

$$\text{Then } C_x = \frac{N_s C_s}{N_x} \left[ \frac{E + e_2 C_s'/C_s}{(E - e_1)} \right] \tag{6}$$

The amplifier gain of $A_1$ is selected so that the voltage ratio $$\left[ \frac{E + e_2 C_s'/C_s}{E - e_1} \right]$$

in equation (6) is equal to 1 and this results in $$e_2 = -C_s/C_s' \cdot e_1 \tag{7}$$

The current $I_s'$ does not have to be supplied with a great deal of accuracy since it is only a very small fraction of the total current in $N_s$. Even a modest 10% overall accuracy in the amplifier gain and $C_s'$ value will reduce the lead effects by a factor of 10. To adjust the gain and the $C_s$ value quickly, a simple self-contained calibration facility can be provided in the bridge. However, high-voltage capacitance bridges are frequently operated with only one permanently installed standard capacitor so that there will rarely be a need for readjusting the compensating circuit. In practice, the capacitance $C_s'$ is generally selected to have the same nominal value as $C_s$. The current injection circuit in FIG. 1 can be extended to compensate for lead impedances in the standard capacitor branch.

Amplifier $A_1$ can also be adapted to compensate for errors caused by shield capacitance $C_{gs}$ to provide an additional correction current $I_{gs}$ to winding $N_s$. The lead containing $I_{gs}$ and $C_{gs}$ is shown in dotted lines in FIG. 1 since when different standard capacitors are used, $C_{gs}$ is a somewhat unpredictable quality. For every variation in $C_{gs}$, the amplifier gain would have to be readjusted to compensate for errors due to shield capacitance.

Figure 2:
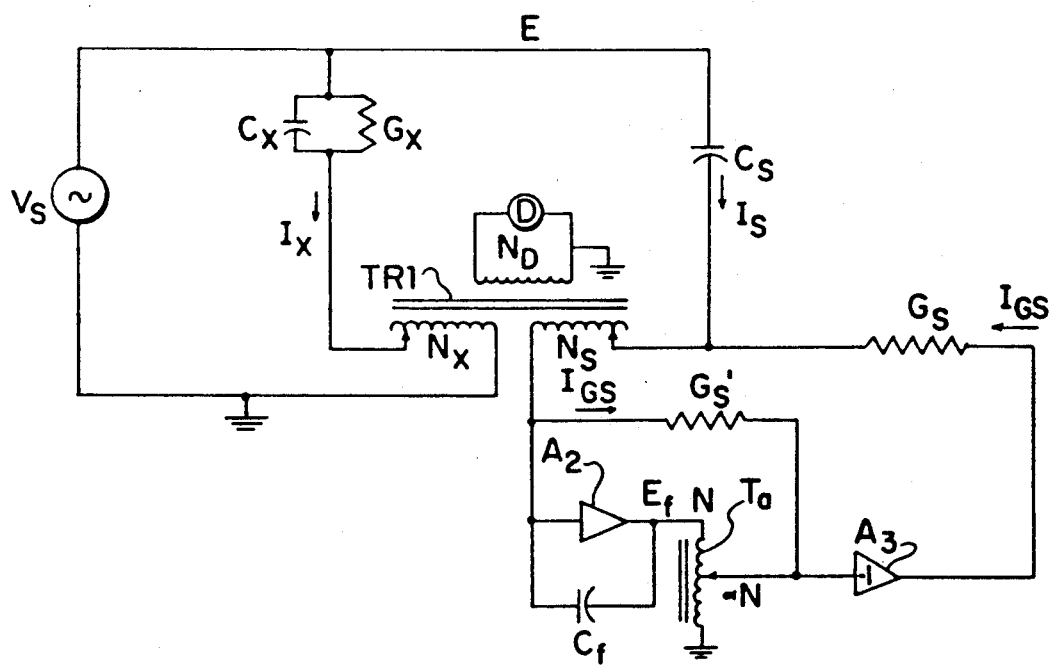
FIG. 2 illustrates a prior art capacitance bridge having a circuit to compensate for the internal impedance of windings of a current comparator.

The circuit shown in FIG. 1 only has a means to measure the capacitance of an unknown capacitor $C_x$ but not any means to measure the conductance associated with $C_x$. A circuit to measure the conductance $G_x$ of unknown capacitor $C_x$ is shown in FIG. 2 which is described in an article by Oskars Petersons et al (IEEE Transactions on Instrumentation and Measurement, op.cit.). The currents in the unknown and standard capacitors are compared in ratio windings $N_x$ and $N_s$ of the current comparator TR1 with the number of active turns in windings $N_x$ and $N_s$ being adjusted until ampere-turn balance is achieved. This portion of the circuit operates in the same manner as the circuit shown in FIG. 1.

The current for balancing the equivalent loss conductance ($G_x$) of the unknown capacitor is generated by capacitor $C_f$, amplifier $A_2$, autotransformer $T_a$, inverting amplifier $A_3$ and a standard conductance $G_s$. It is not practical to connect a standard conductance $G_s$ or an equivalent circuit across the full high supply voltage E. This difficulty is overcome by generating an auxiliary potential $E_f$ which is an accurate scaled down replica of the high voltage E. An output terminal of winding $N_s$ is connected to the capacitor $C_f$ and amplifier $A_2$ whose output is connected to the other side of capacitor $C_f$. The current in the reference capacitor $C_s$ is passed through comparator winding $N_s$ to the input of amplifier $A_2$ which input, at bridge balance, is virtually at ground potential. $C_s$ and $C_f$ then act as a capacitive voltage divider and if the gain of amplifier $A_2$ is high, the voltage $E_f$ at the connection between the output of amplifier $A_2$ and capacitor $C_f$ is defined by:

$$E_f = (C_s/C_f)E \quad (8)$$

The output voltage $E_f$ is thus in phase with the high voltage E but reduced in magnitude by the ratio of the capacitance $C_s/C_f$.

The current $I_{GS}$ for balancing the equivalent loss component of the unknown capacitor is generated by $E_f$ through autotransformer $T_a$, inverting amplifier $A_3$ and the standard conductance $G_s$ which is also connected, along with standard capacitor $C_s$, to a tap on winding $N_s$ of current comparator TR1. The autotransformer $T_a$ has N turns with the tap being located at $\alpha N$ turns. The balance equations for this bridge are then $$C_x = (N_s/N_x)C_s \quad (9)$$

and $$G_x = (N_s/N_x)(C_s/C_f)\alpha G_s \quad (10)$$

However it is customary to express the loss component as the dissipation factor DF or tangent of the loss angle ($\delta$). In these terms, the balance equation (10) becomes $$DF = \tan\delta = (G_x/\omega C_x) = \alpha(G_s/\omega C_f) \quad (11)$$

$G_s/\omega C_f$ is constant and any convenient value may be selected for these elements. Therefore, the circuit can be made direct reading for the dissipation factor.

Another standard conductance $G_s'$ which is of the same value as $G_s$, is connected between the input to amplifier $A_2$ and the input to inverting amplifier $A_3$. As a result, a current equal in magnitude to the compensating current $I_{GS}$ is drawn from the input of amplifier $A_2$ which will avoid second-order errors in the bridge reading. Without $G_s'$ the bridge would not be exactly direct reading. By interchanging the connections between the conductances and the inverting amplifier $A_3$, the bridge can measure equivalent negative dissipation factors. This is a necessary feature if the unknown capacitor has lower losses than the standard. It is also required when the bridge is used to measure voltage transformer ratios.

DESCRIPTION OF THE PREFERRED EMBODIMENTS

Figure 3:
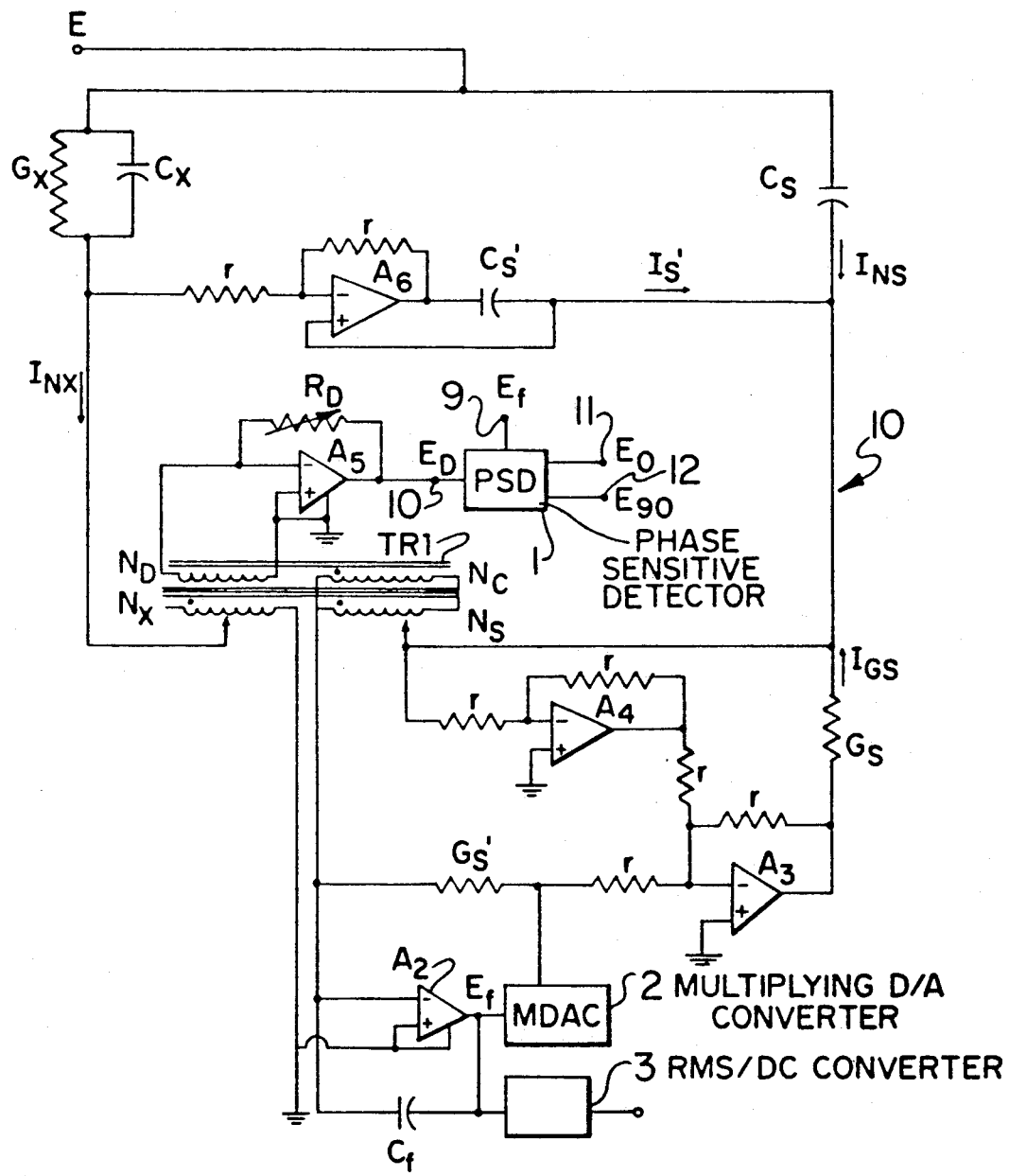
FIG. 3 is a circuit diagram of a current comparator based capacitance bridge according to the present invention.
Figure 5:
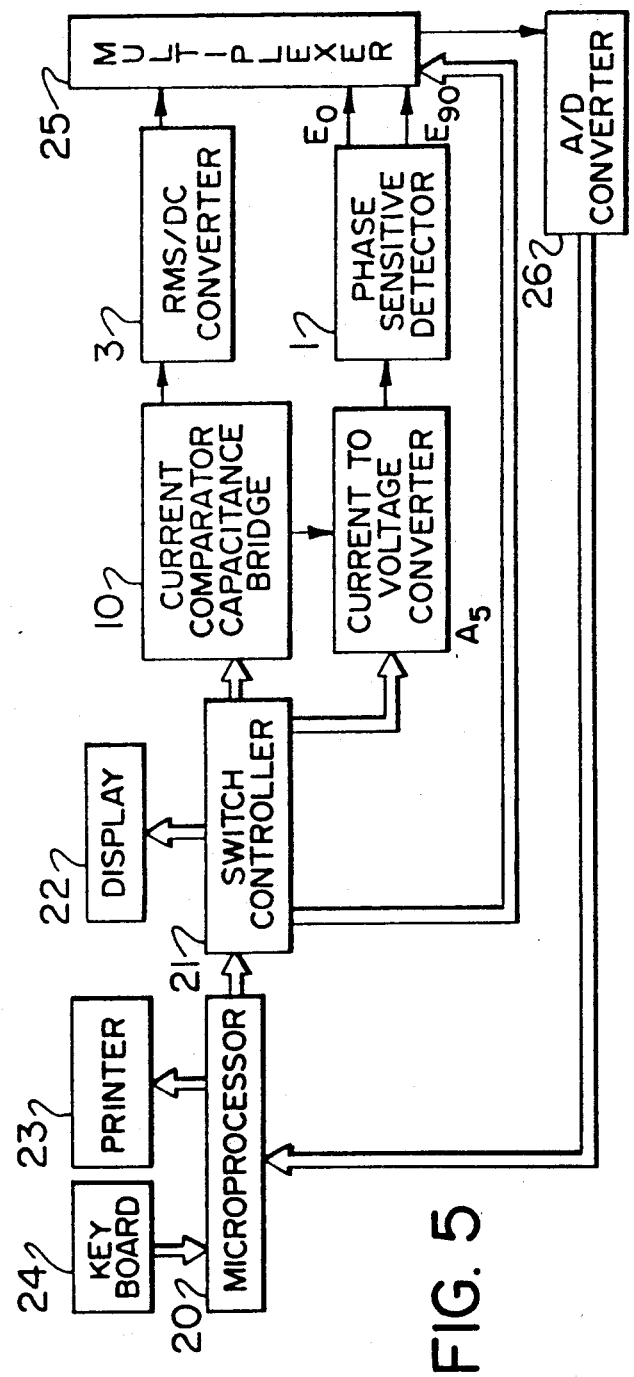

FIG. 3 is a circuit diagram of a current comparator capacitor bridge 10 according to the present invention while FIG. 5 is a block diagram illustrating the control system for that bridge. In this bridge, the high voltage source applies a voltage E to one side of an "unknown" capacitor $C_x$ and to a standard capacitor $C_s$. The other side of "unknown" capacitor $C_x$ is connected to a tap of ratio winding $N_x$ on current comparator TR1, the other end of winding $N_x$ being connected to ground. The low voltage side of standard capacitor $C_s$ is connected to an adjustable tap of ratio winding $N_s$ on current comparator TR1, the further side of $N_s$ being connected to one side of capacitor $C_f$ and a high gain open-loop amplifier $A_2$. The other side of capacitor $C_f$ is connected to the output of amplifier $A_2$ so that $C_f$ is a feedback capacitor for that amplifier. $C_f$ and $A_2$ in combination with capacitor $C_s$ forms, at the output of amplifier $A_2$, a low-voltage $E_f$ which is proportional to the supply voltage E. The low-voltage $E_f$ at bridge balance is equal to $(C_s/C_f)E$, $E_f$ being an accurate scaled down replica of the high voltage E.

The bridge circuit 10 includes a circuit to compensate for errors caused by effects of lead and winding impedances consisting of an amplifier $A_6$ and a capacitance $C_s'$ connected between the low voltage sides of capacitors $C_x$ and $C_s$. In practice $C_s'$ is generally of the same value as standard capacitor $C_s$. This branch of circuit 10 operates in the same manner as amplifier $A_1$ and capacitor $C_s'$ in FIG. 1. Capacitor $C_f$ along with capacitor $C_s$ and high gain amplifier $A_2$ function in the same manner as the elements in FIG. 2 to provide a voltage $E_f$ which is an accurate scaled down replica of voltage E. Instead of applying the voltage $E_f$ to an autotransformer, as previously described with reference to FIG. 2, the voltage $E_f$ in bridge circuit 10 is applied to a multiplying digital-to-analog converter (MDAC) 2. The output of MDAC 2 is applied through a unity gain inverting amplifier $A_3$ and a standard conductance $G_s$ to the adjustable tap on winding $N_s$. This arrangement supplies a current $I_{GS}$ to the tap on winding $N_s$, a current $I_{NS}$ through standard capacitance $C_s$ being also supplied to the adjustable tap on winding $N_s$. The "unknown" capacitor has a conductance value $G_x$ as well as a capacitance value $C_x$. MDAC 2, inverting amplifier $A_3$ and standard conductance $G_s$ can generate a dissipation factor balance current $I_{GS}$ to balance the bridge 10 for an in-phase impedance, the quadrature component being balanced by the current $I_{NS}$.

In order to prevent second order errors in the bridge reading, as previously described with reference to FIG. 2, a conductance $G_s'$ is connected between the input of amplifier $A_2$ and the input of inverting amplifier $A_3$. The effect of the $N_s$ winding impedance is eliminated by introducing a compensating voltage at the output of inverting amplifier $A_3$. This compensating voltage has the same magnitude and phase as those of the voltage drop across the winding impedance of winding $N_s$. This is accomplished by connecting an additional unity gain inverting amplifier $A_4$ between the adjustable tap of winding $N_s$ and the summing input of inverting amplifier $A_3$. In addition a compensating winding $N_c$ is connected in parallel with winding $N_s$ in order to reduce its leakage impedance.

The MDAC 2 in this bridge circuit 10 is of the four quadrant type allowing measurements of equivalent positive and negative dissipation factors without having to interchange connections between the conductances $G_s$ and $G_s$ and the unity gain inverting amplifier $A_3$.

The balanced equation for this bridge is as follows:

$$E(G_x - j\omega C_x)N_x = E j\omega C_s N_s - \alpha E(C_s/C_f)G_s N_s \quad (12)$$

where $\omega = 2\pi f$, f being the frequency, and $\alpha$ is the equivalent multiplying factor of an adjustable proportion determining device MDAC 2. From this, the value $C_x = C_s(N_s/N_x)$ and the dissipation factor DF for the "unknown" capacitor can be determined. The dissipation factor $DF = $ loss tangent $\tan \delta = \alpha(G_s/\omega C_f)$ where $\delta$ is the loss angle of the unknown capacitance $C_x$. For 60 Hz, the term $(G_s/\omega C_f)$ can be made equal to 0.1, so that $DF = 0.1\alpha$ and the dissipation factor balance is direct reading in $\alpha$. The value $C_x$ can also be made direct reading in terms of the ratio of the turns $N_s/N_x$ once the value of the standard capacitor $C_s$ is established.

The current comparator TR1 is provided with a detection winding $N_D$ for detecting a balanced condition of the bridge where the ampere-turns by currents ($I_{NS} + I_{GS}$) and $I_{NX}$ in windings $N_s$ and $N_x$ respectively are equal and opposed to each other. The detection winding $N_D$ is connected to a current-to-voltage converter $A_5$ which provides an output signal $E_D$ that is applied to an input terminal 10 of a phase sensitive detector 1. Current-to-voltage converter $A_5$ has four gain settings covering four decades of operation, the gain being controlled by feedback impedance $R_D$. The voltage $E_f$, which is a reduced replica of voltage E, is applied to input terminal 9 of phase sensitive detector 1 which supplies output signals $E_O$ and $E_{90}$ on terminals 11 and 12 respectively.

Figure 4:
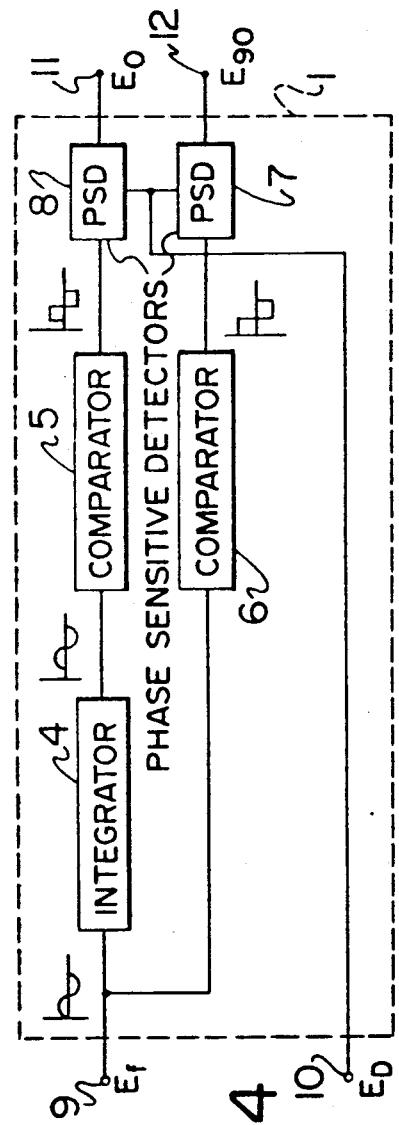
FIG. 4 is a circuit diagram of a phase sensitive detector for the capacitance bridge shown in FIG. 3 and, FIG. 5 is a block diagram of a microprocessor controlled high voltage capacitance bridge according to the present invention.

The basic circuit of the phase sensitive detector 1 is shown in FIG. 4 and includes in-phase and quadrature phase sensitive detectors of the gating type 8 and 7 respectively. The reduced replica voltage $E_f$ from amplifier $A_2$ is applied to input terminal 9 and then to a first comparator 6 which supplies a first square wave reference signal. $E_f$ is also applied through an integrator 4 to a second comparator 5 to supply a second square wave reference signal. The detection winding signal $E_D$, from current-to-voltage converter $A_5$, at input terminal 10 is applied to a phase sensitive detector 8 of the gating type along with the second square wave reference signal to provide an in-phase signal $E_O$ at output terminal 11. The signal $E_D$ is also applied to a phase sensitive detector 7 of the gating type along with the first square wave reference signal to provide a quadrature signal $E_{90}$ at output terminal 12. The gating-type detector will respond to the fundamental frequency as well as to any odd harmonics. Therefore, the signal $E_D$ is prefiltered (not shown) at the detector input.

The adjustable taps for the windings in this bridge are created by switching of the winding turns using reed relays in a make-before-break sequence under control of a microprocessor 20 through a switching controller 21 as illustrated by the block diagram in FIG. 5. The microprocessor 20 controls the gain setting for current-to-voltage converter $A_5$ through the switch controller 21 and also controls all of the features of the bridge including the self-balancing procedure, the data formatting and the input-output processing. The measurement process that is performed automatically by the bridge can be considered to consist of the following three steps:

1) Measuring the current $I_{NS}$ in the reference side of the bridge, i.e. in the $N_s$ winding, the in-phase and quadrature outputs of the phase sensitive detector and storing the results.

2) Calculating and adjusting or revising the settings of the $N_s$ winding, the $N_x$ winding if necessary, as well as the gain of MDAC 2 based on results obtained in step 1, and 3) Repeating steps 1 and 2 until the bridge is balanced.

The $I_{NS}$ current is measured by measuring the RMS value of output voltage $E_f$ from amplifier $A_2$ using a RMS/DC converter 3 as shown in FIG. 3. $I_{NS}$ can then be calculated by microprocessor 20 from the formula $$I_{NS} = E_f \omega C_f \quad (13)$$

where $\omega = 2\pi f$, f being the frequency, and $C_f$ is the capacitances of the feedback capacitor for amplifier $A_2$. $E_f$ is a reduced replica of E such that $E_f = E(C_s/C_f)$. The output of RMS/DC converter 3 is applied as a signal $E_{INS}$ to a multiplexer 25 whose output is applied via a 12-bit A/D converter 26 to microprocessor 20 which can then determine the $I_{NS}$ current. The in-phase ($E_O$) and quadrature ($E_{90}$) outputs of the phase sensitive detector 1 are also sent to microprocessor 20 via multiplexer 25 and A/D converter 26. $E_O$ and $E_{90}$ are a measure of the in-phase and quadrature ampere-turn unbalance in the current comparator TR1.

The DC offsets present in the phase sensitive detectors are cancelled by performing a second measurement with the polarity of the detection winding reversed. Subtracting the digital representations of the detector outputs, obtained before and after the polarity reversal, eliminates all DC offset errors. These measurements are stored in a memory of microprocessor 20 and processed to yield the proper settings for the $N_s$ winding, $N_x$ winding and the gain of MDAC 2. The proper settings for the $N_s$ winding and MDAC 2 to achieve a balance are:

$$N_s = (N_D/I_{NS}) \cdot (E_O/R_D) \quad (14)$$

and $$DF = 0.1\alpha = (1/I_{NS}) \cdot (N_D/N_s) \cdot (E_{90}/R_D) \quad (15)$$

where $E_O$ and $E_{90}$ are the in-phase and quadrature outputs, respectively, of the phase sensitive detector 1.

In one particular bridge circuit of the type shown in FIG. 3, the ratio windings $N_s$ and $N_x$ have a nominal 100 turns providing two-digit resolution. Additional resolution in winding $N_s$ can be obtained by cascading a 100 turn two-stage current transformer for the third and fourth digits and a 100 turn single-stage transformer for the fifth and sixth digits. Winding $N_x$ is subdivided to yield overall ratios multipliers of 1,2,5,10,20,50 and 100. The nominal rating of the comparator and auxiliary transformers in cascade is one ampere-turn which limits the current in the $N_s$ and $N_x$ windings to 0.01 A and 1 A, respectively. For ratios larger than 100 to one, up to 100,000 to one, and to accommodate load currents of up to 1000 A, an additional range-extending two-stage current transformer with ratios of 1000, 100 and 10 to one is cascaded into the $N_x$ winding. The compensating winding $N_c$, which is connected in parallel with the $N_s$ windings to reduce its leakage impedance, also has 100 turns. In this bridge, a 500-turn detection winding $N_D$ is connected to a current-to-voltage converter $A_5$ to obtain a voltage proportional to, and in-phase with, the unbalanced ampere-turns in the current comparator.

The bridge settings at the start of the measurement process, unless specified otherwise by the operators, are the default settings which are: the $N_s$ winding set at zero turn; the $N_x$ winding set at 1 turn (ratio multiplier of 100) and the current-to-voltage converter $A_5$ set at its lowest gain. Since $N_x = 1$ turn, the calculated $N_s$ value is numerically equal to the winding ratio $N_s/N_x$. If the calculated $N_s$ value is greater than 100, the measurement process is stopped and a message is displayed or printed (by items 22 and 23 as shown in FIG. 5) indicating that an external range extender is required to complete the measurement process. For a calculated $N_s$ value of less than or equal to 100, the ratio multiplier of the $N_x$ winding, the $N_s$ winding turns, and the equivalent multiplying factor $\alpha$ of the MDAC 2 are set accordingly.

In the iteration process (previously mentioned steps 1 and 2 being repeated) the resulting calculated $N_s$ and DF values become correction values $\Delta N_s$ and $\Delta DF$, respectively. These correction values are then added to, or subtracted from, the previous settings obtained in order to revise the bridge balance. Before each iteration, the gain of the current-to-voltage converter $A_5$ is increased by a factor of ten, up to the maximum sensitivity. Four iterations or fewer are required to advance from the lowest to the higher sensitivities, a process that may require up to 20 seconds. A balanced condition of the bridge is achieved when $\Delta N_s$ and $\Delta DF$ are less than or equal to 1 ppm. This 1 ppm limit is under control of the operator and can be set to another value during initialization of the bridge. To accommodate a measurement capability of 10% for the dissipation factor DF with 1 ppm resolution, a 17-bit MDAC 2 is used.

Provided that the ratio, multiplier and gain settings need not be changed after reaching a balance, this particular bridge recycles and provides new measurements at a rate of about once every 3 seconds. The balance settings are displayed and, if desired, printed along with the capacitance and dissipation factor of the "unknown" capacitor and the applied high voltage. The use of this bridge is facilitated by nested menus which guide the operator through different modes of operation. For example, if the nominal value of the "unknown" capacitor is known and entered as data via the keyboard, the bridge settings are automatically preset and balance may be reached in about 10 seconds.

Various modifications may be made to the preferred embodiments without departing from the spirit and scope of the invention as defined in the appended claims.

I claim:

1. In a current comparator bridge for measuring values of an unknown impedance, said bridge comprising
   (a) a current comparator having a pair of ratio windings ($N_s$, $N_x$) and a detection winding ($N_D$) for detecting an ampere turns unbalance in the comparator,
   (b) means for varying the number of turns on a first one ($N_s$) of said ratio windings,
   (c) a standard capacitor ($C_s$) having a first side connected to a first end of said first ratio winding,
   (d) means for connecting a first side of an unknown impedance to a first end of the second ratio winding,
   (e) means connecting the second end of the second ratio winding to ground,
   (f) means for connecting the second side of the standard capacitor and the second side of the unknown impedance to an alternating voltage input (E),
   (g) means connected between the second end of the first ratio winding and ground for generating a voltage replica ($E_f$) of the high voltage input,
   (h) converter means connected to receive said replica voltage for providing a current ($I_{GS}$) proportional to and in phase with the high voltage input,
   (i) means for varying the value of said proportional current, and
   (j) means connecting said converter means to the first end of the first ratio winding for passing said proportional current therethrough in phase with the voltage input, the improvement comprising
   (k) phase sensitive detecting means connected to said detection winding and to said replica voltage for generating a first output signal ($E_O$) proportional to an ampere-turn unbalance in the comparator in phase with a reference current ($I_{NS}$) passing through the standard capacitor, and a second output signal ($E_{90}$) proportional to an ampere-turn unbalance in the comparator in quadrature with said reference current,
   (l) an RMS/DC converter connected to the second end of the first ratio winding for generating a third output signal ($E_{INS}$) proportional to the RMS value of the voltage input and hence proportional to the value of said reference current in the standard capacitor, and
   (m) a microprocessor connected to receive said first, second and third output signals for controlling said means (b) for varying the number of turns on the first ratio winding and said means (i) for varying the value of said proportional current to bring the bridge towards ampere-turn balance with the number of turns on the first ratio winding proportional to the ratio ($E_O/E_{INS}$) between said first and third signals providing a measure of the value of the reactance of the unknown impedance, said third signal ($E_{INS}$) providing a measure of the value of the reference current ($I_{NS}$), and the ratio ($E_{90}/E_{INS}$) between the second and third signals providing a measure of the value of the dissipation factor of the unknown impedance.

2. A bridge according to claim 1, including
   (n) a first unity gain inverting amplifier ($A_3$) having a summing input connected to said converter means (h) for generating said proportional current,
   (o) a first standard conductance ($G_s$) connected between an output of said first amplifier and the first end of the first ratio windings,
   (p) a second standard conductance ($G_s$) connected between the second end of the first ratio winding and the summing input of the first amplifier
   (q) a second unity gain inverting amplifier ($A_4$) having an input connected to the first end of the first ratio winding and an output connected to the summing input of the first amplifier.

3. A bridge according to claim 1, wherein the phase sensitive detecting means (k) comprise
   (r) a current-to-voltage converter ($A_5$) connected to the detection winding to generate a voltage output ($E_D$) corresponding to the current in said detection winding,
   (s) a first comparator connected to receive said replica voltage ($E_f$) for providing a first square wave reference signal, (t) a second comparator connected through an integrator to receive said replica voltage ($E_f$) for providing a second square wave reference signal, and (u) first and second phase sensitive detectors both connected to receive said voltage output ($E_D$) from the current-to-voltage converter and each connected to receive a respective one of said reference signals, an output of the first phase sensitive detector providing said second output signal ($E_{90}$) and an output of the second phase sensitive detector providing said first output signal ($E_O$).

* * * * *

UNITED STATES PATENT AND TRADEMARK OFFICE
CERTIFICATE OF CORRECTION

PATENT NO. : 5,113,140
DATED     : May 12, 1992
INVENTOR(S) : Eddy So

It is certified that error appears in the above-identified patent and that said Letters Patent is hereby corrected as shown below:

Each of Figs 3 and 5 is amended to include the reference symbol $E_{INS}$ applied to the output of the RMS/DC CONVERTER 3 at the foot of Fig. 3 and at the input to the MULTIPLEXER 25 from the RMS/DC CONVERTER 3 in Fig. 5.

Signed and Sealed this

Third Day of January, 1995

*Attest:*

BRUCE LEHMAN

*Attesting Officer*  *Commissioner of Patents and Trademarks*